United States Patent
Zortea et al.

(10) Patent No.: US 7,979,041 B1
(45) Date of Patent: Jul. 12, 2011

(54) OUT-OF-CHANNEL RECEIVED SIGNAL STRENGTH INDICATION (RSSI) FOR RF FRONT END

(75) Inventors: Anthony Eugene Zortea, Pipersville, PA (US); Matthew W. McAdam, Vancouver (CA); Mark Hiebert, New Westminster (CA); Trent Owen McKeen, North Vancouver (CA)

(73) Assignee: PMC-Sierra, Inc., Santa Clara, CA (US)

( * ) Notice: Subject to any disclaimer, the term of this patent is extended or adjusted under 35 U.S.C. 154(b) by 830 days.

(21) Appl. No.: 11/952,463

(22) Filed: Dec. 7, 2007

(51) Int. Cl.
*H04B 1/06* (2006.01)
*H04K 3/00* (2006.01)
(52) U.S. Cl. .................... 455/232.1; 375/345
(58) Field of Classification Search ........... 455/232.1, 455/234.1–234.2, 235.1, 240.1, 241.1, 245.2, 455/247.1, 251.1, 253.2; 375/345
See application file for complete search history.

(56) References Cited

U.S. PATENT DOCUMENTS

| | | | |
|---|---|---|---|
| 5,204,976 A * | 4/1993 | Baldwin et al. | 455/234.2 |
| 6,498,926 B1 | 12/2002 | Ciccarelli et al. | |
| 6,961,552 B2 | 11/2005 | Darabi et al. | |
| 7,079,825 B2 | 7/2006 | Wieck | |
| 7,212,798 B1 | 5/2007 | Adams et al. | |
| 2007/0047670 A1 * | 3/2007 | Chen | 375/316 |
| 2008/0018508 A1 * | 1/2008 | Filipovic et al. | 341/118 |

* cited by examiner

*Primary Examiner* — Lee Nguyen
(74) *Attorney, Agent, or Firm* — Knobbe Martens Olson & Bear LLP

(57) ABSTRACT

The signal strength of an out-of-channel interferer is estimated by measuring the transition density of the sign of the down-converted signal. RF interferers at a higher or lower frequency than the desired RF signal appear as high frequency content in the down-converted signal, thus increasing the likelihood of zero-crossings.

22 Claims, 4 Drawing Sheets

OUT-OF-CHANNEL RECEIVED SIGNAL STRENGTH INDICATION (RSSI) FOR RF FRONT END

BACKGROUND OF THE INVENTION

1. Field of the Invention

The invention generally relates to radio frequency receivers. In particular, the invention relates to techniques for mitigating the effects of interfering signals near in frequency to a desired signal.

2. Description of the Related Art

There are many types of data receivers in electronic equipment. Examples include wireless local area networks (WLAN), wireline networks, personal area networks, cell phone services, cable modems, DSL modems, satellite communications, and the like. Wireless systems, such as IEEE 802.11 for WLAN, IEEE 802.16 for broadband Wireless-MAN, and Bluetooth for personal area networks, are particularly prone to interference from signals that are close in frequency to the signal that is actually intended to be received.

Two basic techniques are commonly used in the industry to handle interfering signals. In a first technique, the signal magnitude is compared before and after filtering to determine the presence of an out-of-channel interferer. In a second technique, the linearity of a radio frequency and/or baseband circuit is adjusted based on the signal level. Examples of these techniques are illustrated in, for example, U.S. Pat. No. 6,961,552 to Darabi, et al., U.S. Pat. No. 7,212,798 to Adams, et al., U.S. Pat. No. 6,498,926 to Ciccarelli, et al., and U.S. Pat. No. 7,079,825 to Wieck.

BRIEF DESCRIPTION OF THE DRAWINGS

These drawings and the associated description herein are provided to illustrate specific embodiments of the invention and are not intended to be limiting.

DETAILED DESCRIPTION OF PREFERRED EMBODIMENTS

Figure 1:
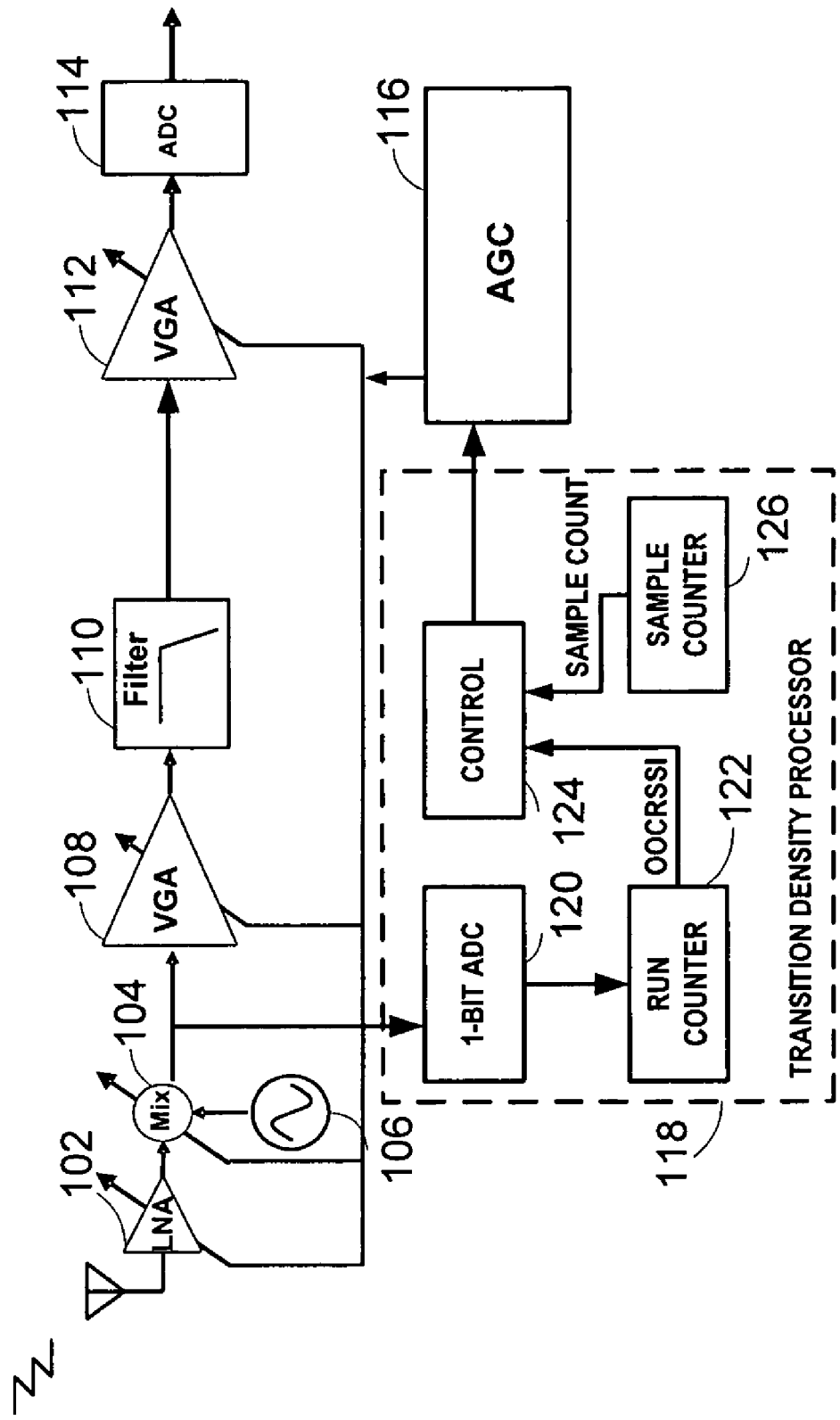
FIG. 1 illustrates an architecture of a receiver with an out-of-channel receive signal strength indicator.

FIG. 1 illustrates an example direct conversion radio receiver with an out-of-channel receive signal strength indicator according to an embodiment of the invention. While illustrated in the context of a direct conversion radio receiver, the principles and advantages described herein are applicable to other types of receivers, such as superheterodyne receivers. In addition, the illustrated techniques are applicable to both wireless systems and to wireline systems.

The illustrated receiver has a low noise amplifier (LNA) 102, a downconverter 104, a local oscillator 106, a first variable gain amplifier (VGA) 108, a low-pass filter 110, a second VGA 112, and an analog-to-digital converter (ADC) 114. For example, an output of the ADC 114 can be provided as an input to a digital modem portion of the receiver (not shown). There are several stages of gain controlled by the AGC 114. In the illustrated embodiment, these stages are the LNA 102, the downconverter 104, and the two VGAs 108, 112. A given total system gain can be achieved with different sets of individual gains. For example, a total system gain of 40 dB may be achieved by setting the LNA 102 to 25 dB, and the remaining 3 adjustable gain stages 104, 108, 112 to 5 dB each; or by setting the second VGA 112 to 25 dB and the first three adjustable gain stages 102, 104, 108 to 5 dB each. It will be understood that the particular components that will be variable gain can vary depending on the design of a receiver. The various adjustable gain stages 102, 104, 108, 112 are controlled by an automatic gain control (AGC) 116, which in turn is at least partially controlled by a transition density processor 118, which will be described later.

In a system with cascaded gain stages, the following tradeoffs exist. For example, in the first case described earlier with 25 dB of gain for the LNA 102, and with the remaining three adjustable gain stages 104, 108, 112 having 5 dB of gain each, relatively more of the gain is distributed early in the signal path, which typically provides the total system with relatively better noise performance. In the second case, with the second VGA 112 at 25 dB of gain and the first three adjustable gain stages 102, 104, 108 at 5 dB each, more of the gain is distributed later, which typically provides relatively better linearity performance.

One embodiment of the invention determines a relatively good compromise for the distribution of gain between relatively better noise performance and relatively better linearity performance for relatively good overall performance based on the strength of the interfering signal.

Two scenarios of interfering signals are described for the purposes of illustration. First, a case will be described with a relatively small desired signal (considered "in-channel") and an interferer (considered "out-of-channel") ("OOC interferer") that is relatively smaller; and second, a case will be described when the out-of-channel (OOC) interferer is large relative to the desired in-channel signal.

In the first case, with the OOC interferer relatively small with respect to the desired signal, better noise performance is typically desired, and most of the total gain should be provided by the early gain stages. In the second case, with a relatively large OOC interferer, more of the gain should be provided by the later stages after the OOC interferer has been filtered, which avoids saturating the earlier gain stages.

The indicator used to measure the relative strength of the OOC interferer is referred to as an "Out-of-Channel Receive Signal Strength Indicator," or "OOCRSSI." In the illustrated embodiment, the OOCRSSI is an output of a run counter 122, corresponding to a count of the number of runs of zeroes or ones in a given time period.

In the illustrated embodiment of FIG. 1, the zero-crossing density of the down-converted signal are efficiently computed by the transition density processor 118 by examining the runs of the sign, i.e., positive or negative, of the down-converted signal. The illustrated transition density processor includes a 1-bit analog-to-digital converter (ADC) 120, the run counter 122, and a control circuit 124. As will be explained later, the 1-bit ADC 120 can be implemented by, for example, a sampler and a comparator or by a sampler and a slicer.

Whether or not an OOC interferer is at a higher or lower RF frequency than the desired signal, when the OOC interferer is down-converted to baseband, the OOC interferer manifests itself as an OOC interferer at a higher frequency than the down-converted desired signal and an OOC interferer at a lower frequency than the down-converted desired signal.

Figure 2:
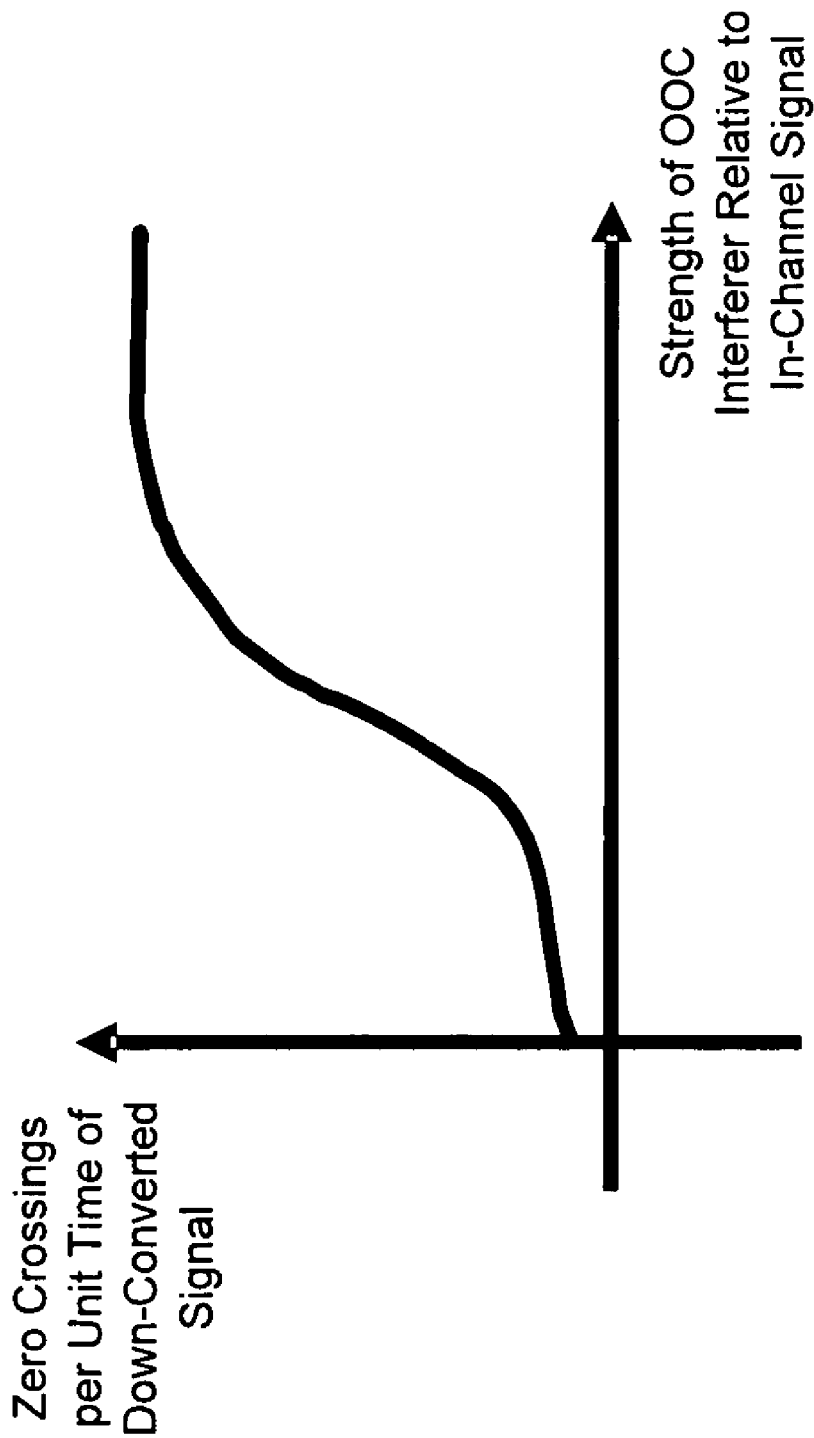
FIG. 2 illustrates the relationship of zero-crossings of a down-converted signal to interferer strength.

This higher frequency OOC interferer at baseband has the effect of increasing the number of zero-crossings of the received signal. The greater the relative strength of the interferer, the more likely the received signal will cross zero more often. This property is used to advantage by one embodiment of the invention. This relationship is illustrated graphically in FIG. 2. If the output of the 1-bit ADC 120 is zero or one, then each string of consecutive zeroes and each string of consecutive ones is a run. In one embodiment, the run counter 122 generates a count of the number of runs of zeroes or ones, or both zeroes and ones. Alternatively, transitions between zeroes and ones can be counted. The various thresholds used for comparison can accordingly be adjusted based on what is counted.

The strength of an OOC interferer relative to an in-channel signal is indicated along the x-axis. The number of zero-crossings per unit time is indicated along the y-axis. As illustrated, the number of zero-crossings per unit time increases with increasing relative strength.

The runs of the sign of the down-converted signal are analyzed by the 1-bit ADC 120 and the run counter 122. The 1-bit ADC 120 can be implemented by, for example, a sampler and a comparator or by a sampler and a slicer. In this context, the 1-bit ADC 120 does not refer to a delta-sigma modulator, but rather to a binary conversion for determining zero-crossings. Of course, more than 1-bit can be used if desired to determine a zero-crossing. A clock signal (not shown) provides a time reference for an applicable instant in time for sampling by the 1-bit ADC 120. For example, the run counter 122 can count the number of zero crossings by counting the number of times that output of the 1-bit ADC 120 went from zero to one or vice-versa. For example, the run counter 122 can include logic to generate a logical AND of (a) an inverse of the previous state of the output of the 1-bit ADC 120 and (b) the current state of the output of the 1-bit ADC. If the output of the AND gate is a logical one, then a transition from zero to one has occurred and can be counted for the run count. A sample counter 126 maintains a count of the number of samples of data taken by the 1-bit ADC 120 (referred to in FIG. 3 as "sample count"). The sample count is used to determine when a sufficient data has been collected for analysis.

The control circuit 124 can receive run count (OOCRSSI) from the run counter 122 and the sample counts from the sample counter 126 and determine a configuration, e.g., a low-noise configuration or a high-linearity configuration, to use. The control circuit 124 can be a state machine that can be implemented by hardware, by software (including firmware) or by a combination of both hardware and software. For example, control logic embodying the state machine illustrated in FIG. 3 can be used to implement the control circuit 124.

Figure 3:
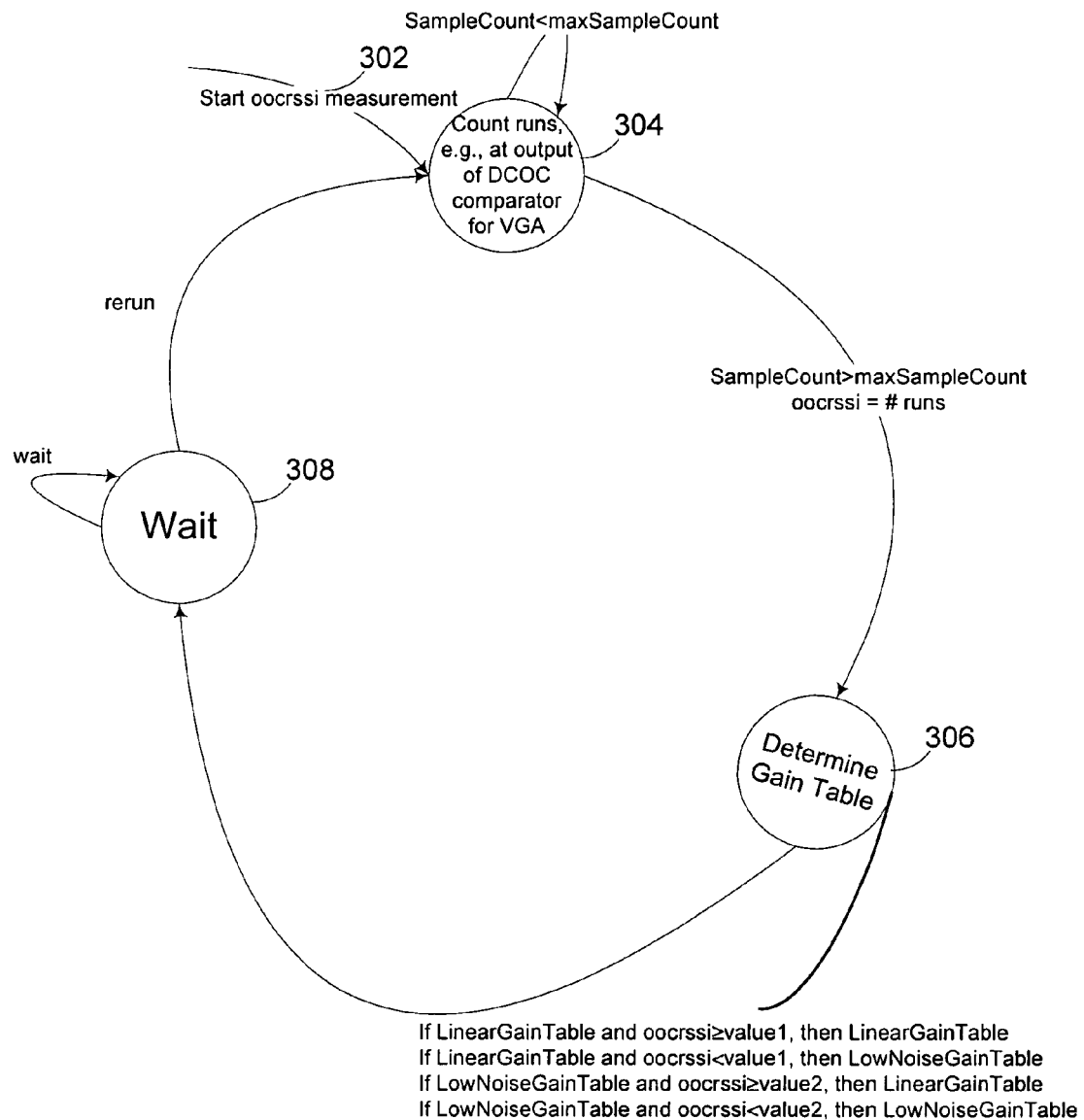
FIG. 3 illustrates a state diagram for a state machine for the transition density processor.

FIG. 3 illustrates a state diagram for a state machine for the control circuit 124. The state machine begins 302 the control process by entering a state 304. For example, the run count (OOCRSSI) and the sample counts can be initialized to zero.

In the state 304, the state machine waits while the run counter 122 counts zero crossings (0 to 1 transitions, 1 to 0 transitions, or both). In one example, an output of a DC offset correction (DCOC) comparator for the first VGA 108 (FIG. 1) is monitored by the 1-bit ADC 120 (FIG. 1). This is illustrated in the signal path between the down-converter 104 (FIG. 1) and the first VGA 108 (FIG. 1). Alternative points in the receiver path can be monitored and more than one point can be monitored as well to ascertain the relative level of the OOC interferer.

While the sample count is less than the maximum sample count (typically a predetermined number), the state machine remains in the state 304. The maximum sample count should correspond to a number sufficient to have received enough relevant data for the transition density processor to collect valid crossing data, e.g., run data. An appropriate value to use for the maximum sample count will of course vary with the clock speed used and will be readily determined by one of ordinary skill in the art.

When sufficient data has been collected for analysis, such as indicated by the sample counts exceeding the value for the maximum sample count, the state machine advances from the state 304 to a state 306 to determine which gain table to use. In the illustrated embodiment, there are two gain tables, and the particular gain table that is selected is based on a combination of the gain table being used and the run count (variable named OOCRSSI in the state diagram). For example, the gain table can be stored in non-volatile memory and accessed by the AGC 116 (FIG. 1). The state machine selects from a linear gain table or a low noise gain table. The linear gain table is used for better linearity performance, and the low noise gain table is used for better noise performance. For example, each gain table can store appropriate gain settings for varying amounts of total system gain.

Additional gain tables can also be defined, e.g., intermediate gain tables. The illustrated embodiment also has two threshold values, i.e., value1 and value2, for comparison with the encountered run count for determining whether or not to change the table. The threshold values are typically different to introduce hysteresis and because the gain characteristics will render the corresponding measurements different under the same conditions. Typically, the appropriate threshold values and the gain distribution for each table will vary with the characteristics of the particular receiver.

If the linear gain table is being used and the encountered run count (OOCRSSI value) equals or exceeds the first threshold value (value1), this indicates a relatively many zero crossings per unit time, and the continued presence of a relatively strong interfering signal, and the state machine continues with use of the linear gain table.

If the linear gain table is being used and the encountered run count (OOCRSSI value) is less than the first threshold value (value1), this indicates relatively few zero crossings per unit time, and an absence of a relatively strong interfering signal, and the state machine selects the low noise gain table for use.

If the low noise gain table is being used and the encountered run count (OOCRSSI value) equals or exceeds the second threshold value (value2), this indicates the presence of a relatively strong interfering signal, and the state machine selects the linear gain table for use.

If the low noise gain table is being used and the encountered run count (OOCRSSI value) is less than the second threshold value (value2), this indicates the absence of a relatively strong interfering signal, and the state machine selects the low noise gain table for use.

After the appropriate gain table is selected, the state machine advances from the state 306 to a state 308, where the state machine waits until the control process is rerun. For example, the control process can be rerun in response to an elapsed time, a loss of signal, a change in temperature, a change in usage (such as the activation of a transmitter), or the like.

In one embodiment, the illustrated technique is used to determine how the total gain is to be allocated among the variable gain elements of the receiver. The amount of total gain can be determined by the automatic gain control (AGC) 116. For example, the control circuit 124 can provide an indication of whether the linear gain table or the low noise gain table is to be used, and each table can have various control settings for the various adjustable gain stages 102, 104, 108, 112 to implement a total gain.

Figure 4:
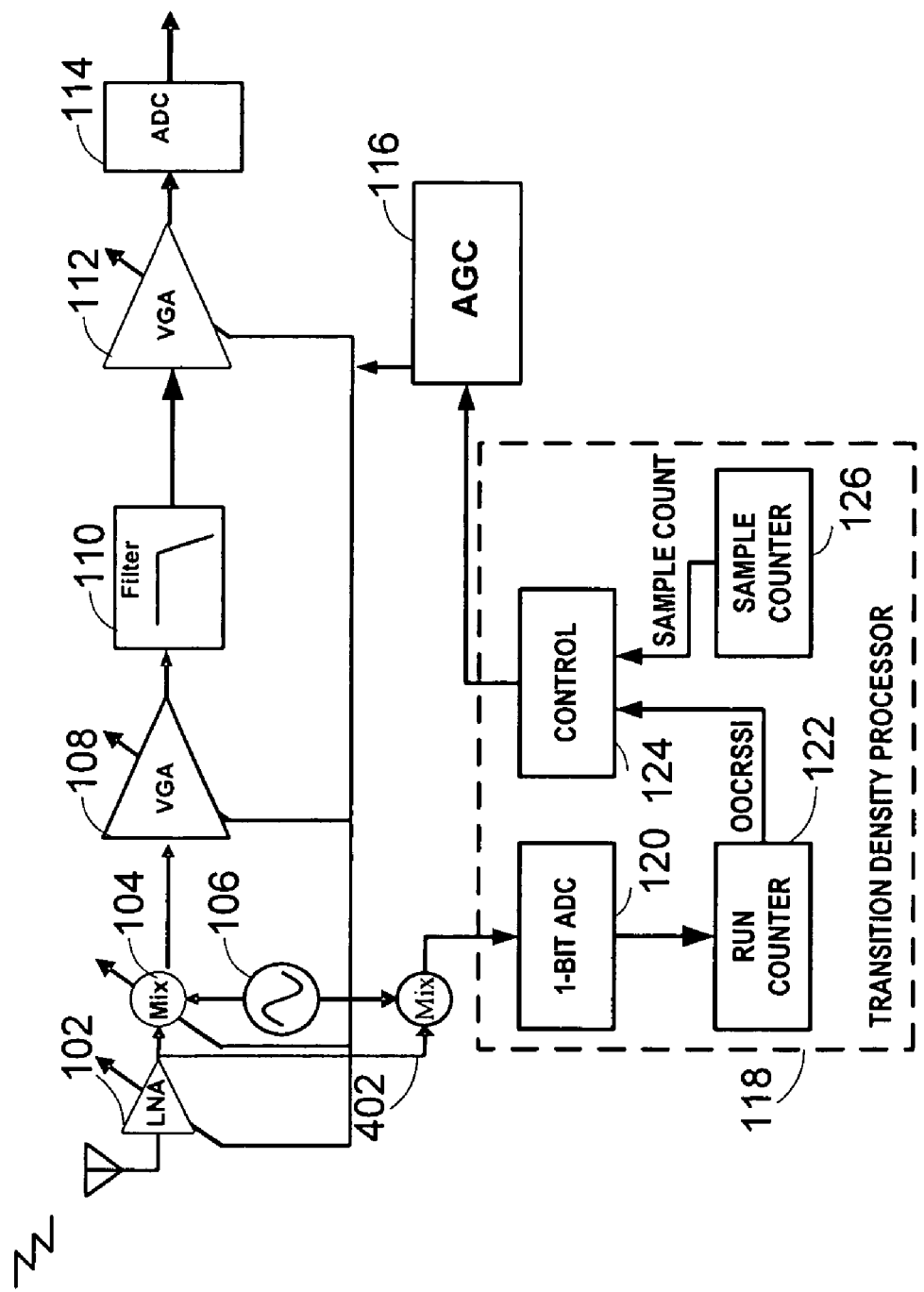
FIG. 4 illustrates an embodiment with a parallel downconversion path.

FIG. 4 illustrates an embodiment with a parallel down-conversion path 402. The parallel down-conversion path 402 for the down-converted signal is added to make the computation of the transition density more robust and to make the other portions of the receiver less vulnerable to deleterious effects of measuring the zero crossings. This parallel down-conversion path 402 has the benefit of having relatively relaxed noise and linearity requirements, since only zero crossing information is used in that path 402.

In another embodiment, an additional 1-bit ADC and an additional run counter can be added at the output of more stages (with or without parallel paths), such as to the outputs of the VGAs 108, 112 and the filter 110, and the transition densities can be combined and used to control both the gain distribution and parameters of the filtering, such as cut-off frequency of the filter 110.

In yet another embodiment, the distribution of gain and the cutoff frequency of filtering can be adaptively adjusted based at least in part on the output(s) of the run counter(s). For example, when a relatively large interfering signal is encountered and the run counts (OOCRSSI values) are relatively low, the system can progressively weigh the gain towards the later stages.

In yet another embodiment, the clock signal used by the 1-bit ADC 120 and the run counter 122 can be made agile in frequency or even be made to jitter, e.g., spread spectrum clocking, to avoid errors with OOC interferers that may occur near the sampling frequency.

Various embodiments have been described above. Although described with reference to these specific embodiments, the descriptions are intended to be illustrative and are not intended to be limiting. Various modifications and applications may occur to those skilled in the art.

What is claimed is:

1. A method of adjusting at least a distribution of gain within a radio frequency (RF) receiver, the method comprising:
   determining a run count associated with a downconverted signal based at least partly on an output of a DC offset correction (DCOC) comparator for a variable gain amplifier; and
   modifying gain of at least one adjustable gain stage based at least partly on the run count.

2. A method of adjusting at least a distribution of gain within a radio frequency (RF) receiver, the method comprising:
   determining a run count associated with a downconverted signal; and
   modifying gain of at least one adjustable gain stage based at least partly on the run count, wherein modifying gain comprises selecting between a more linear gain allocation or a lower noise gain allocation, wherein the more linear gain allocation has less gain at earlier stages of a received signal path and more gain at later stages than the lower noise gain allocation.

3. The method of claim 2, wherein determining comprises converting the downconverted signal to a binary representation, and counting runs associated with at least one state of the binary representation.

4. The method of claim 2, wherein modifying gain comprises modifying gain of at least one adjustable gain stage based at least partly on the run count and at least partly on a previous gain allocation.

5. The method of claim 2, wherein modifying gain comprises allocating gain among multiple variable gain stages.

6. The method of claim 5, further comprising adaptively allocating gain based at least partly on further run counts.

7. The method of claim 2, further comprising:
   comparing the run count to a first value when operating with the more linear gain allocation;
   comparing the run count to a second value different from the first value when operating with the lower noise gain allocation; and
   modifying gain based at least in part on the comparison of the run count and the first value or the second value, as appropriate.

8. The method of claim 2, further comprising:
   when operating with the more linear gain allocation:
      comparing the run count to a first value;
      continuing usage of the linear gain allocation when the run count is at least the first value; and
      switching to the lower noise gain allocation when the run count is less than the first value;
   when operating with the lower noise gain allocation:
      determining whether or not the run count is at least a second value;
      switching to the linear gain allocation when the run count is at least the second value; and
      continuing usage of the lower noise gain allocation when the run count is less than the second value.

9. The method of claim 8, further comprising using a first gain table to implement the linear gain allocation and using a second gain table to implement the lower noise gain allocation.

10. The method of claim 2, further comprising converting the downconverted signal in a parallel path to determine the run count.

11. An apparatus for adjusting at least a distribution of gain within a radio frequency (RF) receiver, the apparatus comprising:
   a transition density processor configured to determine a run count associated with a downconverted signal and to generate a control output based at least partly on the run count:
   a gain controller configured to receive the control output from the transition density processor and to modify a gain of at least one adjustable gain stage of the RF receiver; and
   a 1-bit Analog-to-Digital Converter (ADC) with an input coupled to an output of a DC offset correction (DCOC) comparator for a variable gain amplifier.

12. An apparatus for adjusting at least a distribution of gain within a radio frequency (RF) receiver, the apparatus comprising:
   a transition density processor configured to determine a run count associated with a downconverted signal and to generate a control output based at least partly on the run count; and
   a gain controller configured to receive the control output from the transition density processor and to modify a gain of at least one adjustable gain stage of the RF receiver, wherein the gain controller is configured to select between at least a more linear gain allocation or a lower noise gain allocation based at least partly on the control output, wherein the more linear gain allocation has less gain at earlier stages of a received signal path and more gain at later stages than the lower noise gain allocation.

13. The apparatus of claim 12, wherein the transition density processor comprises a 1-bit Analog-to-Digital Converter (ADC) with an input coupled to the downconverted signal and a run counter coupled to an output of the 1-bit ADC.

14. The apparatus of claim 11, wherein a control circuit of the transition density processor is configured to control a state of the control output at least partly on the run count and at least partly on a previous gain allocation.

15. The apparatus of claim 14, wherein the control circuit is configured to adaptively allocate gain based at least partly on further run counts.

16. The apparatus of claim 11, wherein the gain controller is configured to allocate gain among multiple variable gain stages.

17. The apparatus of claim 11, wherein the transition density processor is configured to:
   compare the run count to a first value when the more linear gain allocation is being used;
   compare the run count to a second value different from the first value when the lower noise gain allocation is being used; and
   to generate the control output based at least partly on the comparison of the run count and the first value or the second value, as appropriate.

18. The apparatus of claim 12, wherein the transition density processor is configured to:
   when the more linear gain allocation is being used:
      compare the run count to a first value;
      continue usage of the linear gain allocation when the run count is at least the first value; and
      switch the gain controller to the lower noise gain allocation when the run count is less than the first value;
   when the lower noise gain allocation is being used:
      determine whether or not the run count is at least a second value;
      switch the gain controller to the linear gain allocation when the run count is at least the second value; and
      continue usage of the lower noise gain allocation when the run count is less than the second value.

19. The apparatus of claim 18, further comprising a first gain table for implementation of the linear gain allocation and a second gain table for implementation of the lower noise gain allocation.

20. The apparatus of claim 12, further comprising a parallel path to a receive path, wherein the transition density processor is coupled to the parallel path to determine the run count of a downconverted signal of the parallel path.

21. A method of adjusting at least a distribution of gain within a radio frequency (RF) receiver, the method comprising:
   determining zero crossings of a downconverted signal; and
   modifying gain of at least one adjustable gain stage based at least partly on an indication associated with a rate of zero crossings, wherein modifying gain comprises selecting between a more linear gain allocation or a lower noise gain allocation, wherein the more linear gain allocation has less gain at earlier stages of a received signal path and more gain at later stages than the lower noise gain allocation.

22. An apparatus for adjusting at least a distribution of gain within a radio frequency (RF) receiver, the apparatus comprising:
   a transition density processor configured to determine zero crossings associated with a downconverted signal and to generate a control output based at least partly on the zero crossings; and
   a gain controller configured to receive the control output from the transition density processor and to modify a gain of at least one adjustable gain stage of the RF receiver, wherein the gain controller is configured to select between at least a more linear gain allocation or a lower noise gain allocation based at least partly on the control output, wherein the more linear gain allocation has less gain at earlier stages of a received signal path and more gain at later stages than the lower noise gain allocation.

* * * * *